United States Patent [19]
Sellers

[11] Patent Number: 5,737,169
[45] Date of Patent: Apr. 7, 1998

[54] INTRINSIC ELEMENT SENSING INTEGRATED SOA PROTECTION FOR POWER MOSFET SWITCHES

[75] Inventor: Jeff C. Sellers, Palmyra, N.Y.

[73] Assignee: ENI, A Division of Astec America, Inc., Rochester, N.Y.

[21] Appl. No.: 608,409

[22] Filed: Feb. 28, 1996

[51] Int. Cl.$^6$ .................................................. H02H 3/00
[52] U.S. Cl. ........................... 361/98; 361/18; 361/86; 361/87
[58] Field of Search ........................ 361/18, 56, 58, 361/91, 93, 94, 98, 86, 79, 87

[56] References Cited

U.S. PATENT DOCUMENTS

| | | | |
|---|---|---|---|
| 4,525,765 | 6/1985 | Brajder | 361/88 |
| 4,703,390 | 10/1987 | Fay et al. | 361/101 |
| 4,809,122 | 2/1989 | Fitzner | 361/18 |
| 5,257,155 | 10/1993 | Robb et al. | 361/18 |
| 5,465,188 | 11/1995 | Pryor et al. | 361/18 |

*Primary Examiner*—Jeffrey A. Gaffin
*Assistant Examiner*—Michael Sherry
*Attorney, Agent, or Firm*—Trapani & Molldrem

[57] ABSTRACT

A protective circuit for a power field effect transistor, e.g., a power MOSFET, employs a diode-switched pickup circuit, a threshold detector, and a timer. The pickup circuit includes a resistor and diode in series, with the diode connected with the MOSFET drain electrode and the resistor connected with the gate driver for the MOSFET gate electrode. A pickup voltage $V_1$ appears at the junction of the diode and resistor. When the MOSFET is conducting the pickup voltage is the sum of the channel voltage $V_{ds-on}$ and the diode forward voltage $V_f$. When the MOSFET is biased OFF, the pickup voltage is zero. The threshold detector compares the pickup voltage with a reference voltage that is offset some predetermined amount from the source electrode voltage. When threshold circuit goes high, the timer circuit provides a time-out or inhibit signal to an inhibit input of the gate driver circuit. Under high load current or high temperature conditions, the drain-source voltage $V_{ds-on}$ rises, and if the threshold is exceeded, the gate signal is cut off. This holds the transistor OFF for the timer period. This arrangement uses the MOSFET channel resistance $R_{ds}$ as the current sense resistor. The protective circuit can be integrated, and can be combined with the MOSFET in a single package.

6 Claims, 2 Drawing Sheets

INTRINSIC ELEMENT SENSING INTEGRATED SOA PROTECTION FOR POWER MOSFET SWITCHES

BACKGROUND OF THE INVENTION

This invention relates to protective devices for field effect transistors, and especially for switching MOSFETs of the type employed in power supplies for sputtering or plasma applications. The invention is particularly directed to a circuit arrangement that protects the switching transistors from overheating or overpower, and more especially, to a detection circuit that senses the temperature and current performance of a switching MOSFET but does not add significantly to circuit complexity nor interfere with its normal switching operation.

Sputtering is a vacuum deposition process in which a sputtering target is bombarded with ions, that typically emanate from an ionized noble gas, and the atoms of the target material are mechanically freed by momentum transfer. The target material then coats a nearby substrate. The target material can be a metal, e.g., aluminum or nickel. In a reactive sputtering process, a reactive gas is introduced into the deposition chamber, and the freed target material reacts with the reactive gas to form a coating material. Non-reactive sputtering also employs a similar plasma process. The sputtering process takes place in a plasma chamber, where the noble gas is present at very low, near-vacuum pressures. In order to accelerate the noble gas atoms towards the target, a plasma is generated. The plasma is a broad electrical discharge in which the noble gas ions of the plasma are accelerated towards the target, which serves as cathode. The voltage across the plasma is typically between about 300 volts and 700 volts, depending on the target material and the plasma chamber dimensions.

In order to provide electrical power to the plasma chamber, a switched mode converter is often employed, either for constant direct current or pulsed (polar) dc plasma generation. The power conversion is accomplished in a half bridge or full bridge circuit, where power transistors are alternately switched on and off to drive power first in one direction and then in the other through the primary winding of a transformer. Typically, a power MOSFET is used for this, as it is a low-loss, reliable, and relatively inexpensive device.

In switched mode power conversion, there are a number of faults that can result in destruction of the power MOSFET switches, such as over-current, over-power, and over-temperature conditions. To protect the switch transistors thoroughly requires numerous sensing elements, i.e., for temperature sensing, current sensing, and power sensing. Consequently, any protective arrangement for sensing the operating current and temperature conditions of a power switching transistor has always required additional components, such as a current sense resistor in series in the MOSFET source-drain path, or a current sensing transformer. This adds to circuit complexity, increases the equipment cost, and creates additional heat dissipation. A separate sensor has been required for temperature protection in addition to the sensors required for over power and over current protection.

While the problem of over heat and over power protection for switching transistors has been recognized, the typical approach has been to simply protect the overall supply system, rather than protect the transistors themselves. Thus, previous power supplies have had an overall output current limit, but have not recognized the need for independent transistor protection.

Earlier, there have been proposed "smart" FET integrated transistors, which incorporate additional protective systems in the same package as the transistor. These are not standard FETs, and are typically designed for automotive use. Thus, they are generally not available for high power or high voltage applications, but are suited only for the low voltages found in automotive applications.

OBJECTS AND SUMMARY OF THE INVENTION

It is an object of the present invention to provide a protective circuit of simple, straightforward design, and which avoids the drawbacks of the prior art.

It is another object to provide a protective device which directly senses the current and temperature operating characteristics of the MOSFET device, without relying on an external current or temperature sensing element.

It is another object to provide a MOSFET device with a protective circuit that establishes a safe operating area or SOA, in terms of current and temperature conditions.

In accordance with an aspect of this invention, a protective arrangement is employed in conjunction with a power field effect transistor or FET. This can be a power switching device, and typically is a metal-oxide semiconductor device or MOSFET, of the type having a gate electrode, a source electrode and a drain electrode. A channel is defined between said source and drain electrodes that provides a conduction path for a load current. The gate electrode is coupled to a gating signal generator, and gates the channel on and off. The channel or conduction path has a low resistance value when a high gate voltage (e.g., +15 volts) is applied from said gating signal source to said gate electrode and is shut off when a low gate voltage (zero volts) is applied to said gate electrode. A drain-source voltage pickup means includes a resistor coupled to the gating signal generator, and a diode in series with the resistor and connected to said drain electrode of the MOSFET. The resistor and diode define a junction therebetween, and a pickup voltage appears at this junction. A threshold detecting means has one input coupled to receive the pickup voltage from the junction of the drain-source voltage pickup means, and another input coupled to a reference voltage that is offset a predetermined mount relative to said source electrode. The threshold detecting means has a threshold output that is high when the pickup voltage exceeds the reference voltage but is low otherwise. A cutoff circuit means has an input coupled to the threshold output for disabling the gate electrode for a period of time in response to a high level at the output of the threshold detecting means.

In a preferred embodiment the cutoff circuit means comprises timer circuit means having an input coupled to the output of said threshold detecting means and an output providing a gate inhibit signal for a predetermined interval when said threshold output is high. The cutoff circuit means also has a gate inhibit circuit coupled between the gate electrode and the gating signal generator, with an input coupled to receive said gate inhibit signal from the timer circuit means.

Typically, the MOSFET circuit has a gate resistor interposed between the MOSFET gate electrode and the gating signal generator. The resistor of the drain-source voltage pickup means is coupled to the signal-generator end of the gate resistor. Also, the diode for the voltage pickup means can be implemented as a pair of diodes connected in series.

The protective circuit of this invention takes advantage of the property that the channel of a field effect transistor is ohmic in nature. The voltage appearing across the drain-source channel, i.e., the drain-source voltage $V_{ds}$, varies as a function of load current. The channel also has a positive temperature coefficient, and for a given value of load current the drain-source voltage $V_{ds}$ also varies with temperature. In this invention the channel resistance of the MOSFET in the ON state is used as the current-sense resistor for the protective circuit. This arrangement is sensitive to both the current load, i.e., power dissipation, and to the temperature of the device. Consequently, a simple threshold circuit, i.e., a single comparator, can be employed with a single reference voltage or threshold.

In effect, the resistor-diode voltage pickup means "switches on" during the gating period of the MOSFET to sample the drain-source voltage (plus the diode forward voltage) when the transistor is mined ON. This is accomplished by the gate drive signal from the gate generator. When the transistor is gated ON (gating signal high), the voltage that appears at junction is the ON channel voltage plus the diode forward voltage, $V_{ds-on}+V_f$. When the transistor is gated OFF (gating signal low), the diode blocks the drain voltage $V_d$, so a low or zero voltage appears at the junction.

As mentioned above the channel ON resistance, $R_{ds-on}$, is proportional to temperature and to peak current, so that the channel resistance Rain moves to become more sensitive as conditions degrade, i.e., either as working temperature increases or as load current increases. Protection for the FET can be accomplished using a comparator and a time-out circuit. The comparator has one input that meters the pickup voltage, $V_{ds}+V_f$, and a second input that is coupled to a reference voltage $V_{ref}$. The latter represents a threshold voltage, i.e., the maximum tolerable value of $V_{ds}$, offset by the diode forward voltage $V_f$. When the reference voltage $V_{ref}$ is equaled or exceeded, then the comparator starts the time out circuit, which outputs a disable signal for some predetermined time out period, such as several seconds. The time-out or disable signal keeps the gating signal from reaching the gate electrode of the MOSFET, and holds the latter OFF during this period. This prevents a runaway condition from damaging or destroying the MOSFET, and also alerts the operator that some troubleshooting and problem isolation is called for.

It is possible to use separate comparator and timer devices, e.g., one-shot multivibrators, for this. However, it is also possible for a single low-cost part, e.g., a 555 timer, to incorporate both the comparator and timer functions. It is also possible to implement this circuit digitally, rather than using discrete or integrated linear circuit elements.

In one preferred implementation, a single circuit element, e.g., an integrated circuit, can include all these features and has electrodes respectively coupled to the drive signal source and to the drain, gate and source of the power MOSFET. In another preferred implementation, the protective circuit is integrated with the power MOSFET into a single package.

The above and many other objects, features, and advantages of this invention will become apparent from the ensuing detailed description of an illustrative embodiment, which is to be read in conjunction with the accompanying Drawing.

DETAILED DESCRIPTION OF THE PREFERRED EMBODIMENT

Figure 1:
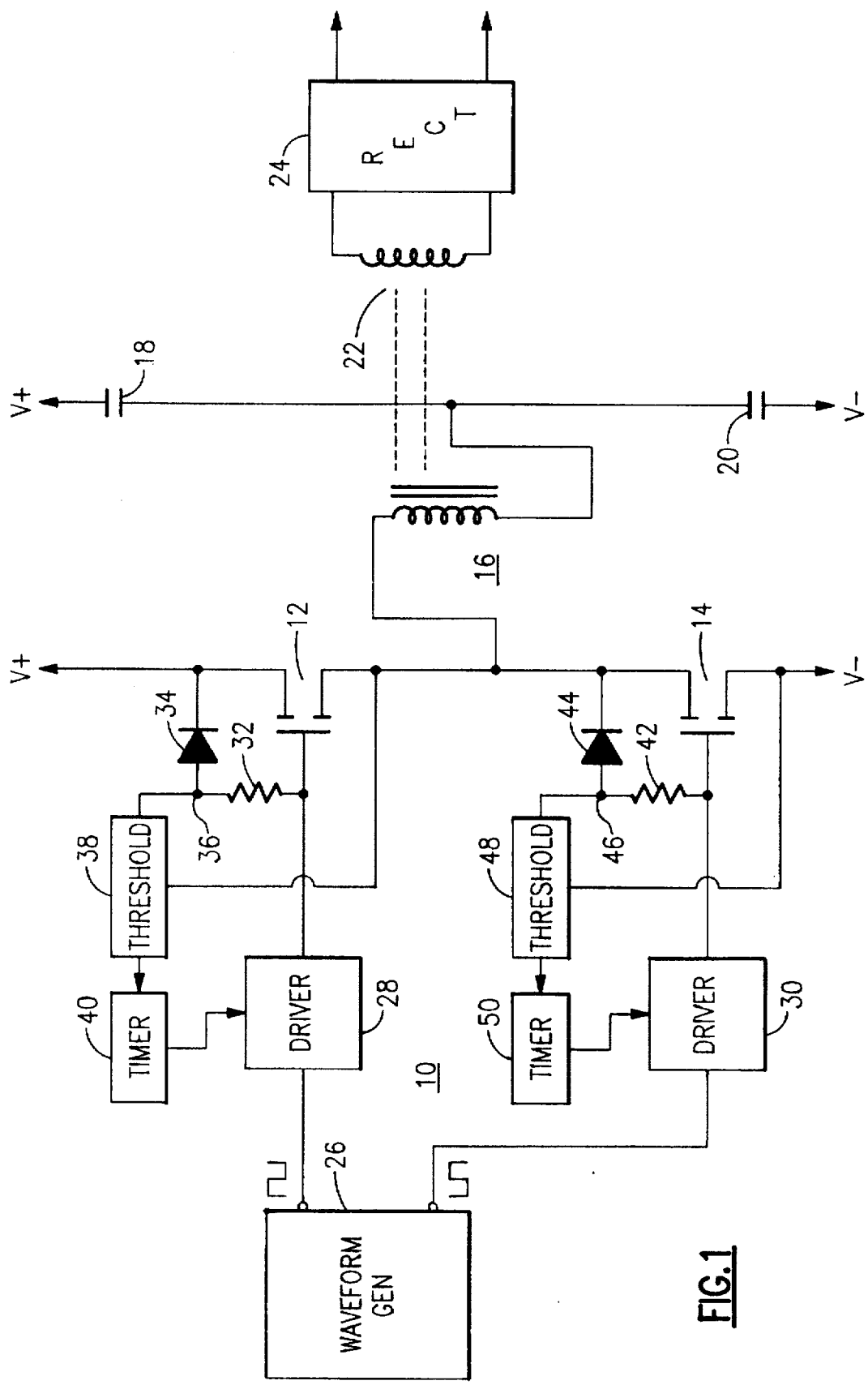
FIG. 1 is a circuit diagram of a pulse dc power supply that incorporates the protective circuit of this invention.

With reference to the Drawing, and initially to FIG. 1, the invention is embodied in a half-bridge switched mode power supply 10. There are many other circuit applications in which a MOSFET must be protected from excessive load current and/or high temperature conditions, but this embodiment serves as an example. Here, there are two MOSFET transistors arranged in push-pull with the drain electrode of transistor 12 connected to the positive rail +V, the source electrode of the transistor 12 connected to the drain electrode of the transistor 14, and the source electrode of the transistor 14 tied to the negative rail −V. A transformer primary winding 16 has one lead connected to the junction of the source electrode of MOSFET 12 with the drain of MOSFET 14, and opposite lead connected to a junction between two series capacitors 18 and 20 that are also coupled between the positive and negative rails +V and −V. The switching MOSFETs 12 and 14 are alternately biased hard on and hard off, so that current pulses back and forth through the primary winding 16. This induces an ac current in a secondary winding 22, which is fed to a rectifier circuit 24 which produces high voltage dc that can be used, for example, in a plasma etching or deposition process. In a practical arrangement, on each side of the push-pull bridge there would be several FETs ganged in parallel. Here these are represented by the single FETs 12 and 14, so illustrated only to minimize clutter in the Drawing figures.

A waveform generator 26 produces push-pull switching or gating signals for controlling the switching of the MOSFETs 12 and 14. The gating signal is applied through an input of a gate driver circuit 28 to the gate electrode of the MOSFET 12, and an opposite gating signal is applied through an input of another gate driver circuit 30 to the gate electrode of the MOSFET 14.

The first MOSFET 12 has an associated source-drain voltage pickup circuit formed of a resistor 32 and a diode 34 in series, with the resistor coupled to the gate electrode and the cathode of the diode 34 coupled to the drain electrode of the MOSFET 12. The resistor 32 and diode 34 form a junction 36 at which appears a voltage $V_1$ that is fed to one input of a threshold detector 38. Another input of this threshold detector is coupled to the source electrode of the MOSFET 12. The threshold detector 38 compares the pickup voltage (from junction 36) with a reference voltage which is offset a predetermined amount above the voltage at the MOSFET source electrode. When the pickup voltage is above the reference level, then the threshold detector sends a high level to a timer circuit 40, and the latter sends an inhibit or time-out signal to an inhibit terminal of the driver circuit 28. The second MOSFET has a similar series circuit formed of a resistor 42 and a diode 44, which form a junction 46 that is tied to an input of a threshold detector 48. The latter has an output tied to a timer circuit 50, which in turn has its output coupled to an inhibit terminal of the driver circuit 30.

Figure 2:
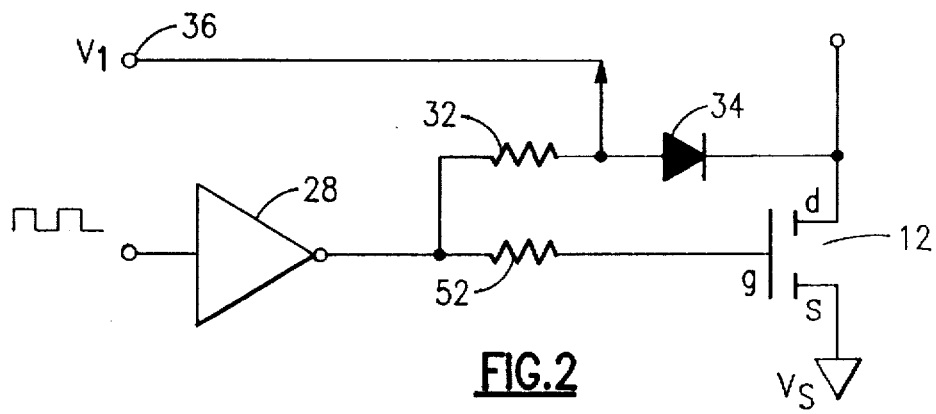
FIG. 2 is a circuit diagram of the drain-source voltage pick-up circuit employed in the embodiment of FIG. 1.
Figure 3:
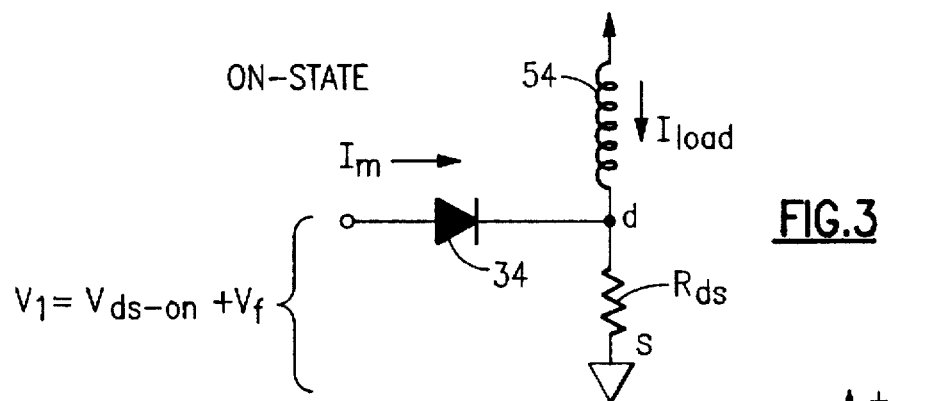
FIG. 3 is a schematic for explaining the operation of this embodiment.

As explained with reference to FIGS. 2 and 3, when the MOSFET 12 is gated ON, the pickup voltage $V_1$ that appears at the junction 36 is equal to the voltage drop $V_{ds-on}$ across the channel of the MOSFET 12, plus the forward voltage $V_f$ of the diode 34. The voltage $V_f$ is a small fixed value of about 0.8 volts, and amounts to a constant offset. As shown in FIG. 2, in practice a gate resistor 52 is interposed between the driver circuit 28 and the gate terminal of the associated MOSFET 12. The resistor 32 is connected to the driver end of the gate resistor 52. Here, the drain electrode d is the positive electrode for the channel of the MOSFET 12 and the source electrode s is the negative electrode. In the configuration shown, when a high gating signal is present to bias the MOSFET hard on, the diode 34 is forward biased. When the gating signal is low to bias the MOSFET cut off, then the diode 34 is reverse biased.

When the MOSFET 12 is biased OFF, then a low or zero volt gate signal appears at the junction 36, and the diode 34 separates the junction 36 from the drain voltage. When the MOSFET is gated into its ON state, as shown schematically in FIG. 3, the voltage $V_1$ at the junction 36 is the sum of the diode forward voltage $V_f$ and the drain-source ON voltage $V_{ds-on}$ across the channel of the MOSFET. In this case, the voltage $V_{ds-on}$ is the product of the drain current times the channel resistance or drain-source resistance $R_{ds}$. The drain current consists almost entirely of the load current $I_{load}$. There is a small metering current $I_m$ through the resistor 32 and diode 34 into the MOSFET drain, but this is an inconsequential contribution to the total drain current.

As mentioned previously, the channel ON voltage $V_{ds-on}$ is proportional to the drain current, so that a rise in this voltage can indicate a dangerous level of drain current. As also mentioned previously, the channel resistance $R_{ds}$ has a positive temperature coefficient, so that for a given current value, a rise in the voltage $V_{ds-on}$ signals a rise in the MOSFET die temperature. Accordingly, if the channel current flow is excessive, or if the MOSFET die temperature becomes excessive, the voltage $V_1$ that is fed to the threshold circuit 38 will rise above the predetermined reference value. This commences the time-out action of the timer circuit 40, and prevents the transistor 12 from gating ON during the prescribed time-out period. When the transistor 12 is running cool, the circuit can sustain higher drain current before the voltage $V_1$ reaches the threshold or cut-out level. On the other hand, when the transistor is running somewhat warmer than normal, the voltage $V_1$ reaches threshold at a somewhat lower load current. In this way, the protective circuit automatically adjusts as appropriate for the existing operating conditions. As operating conditions become more severe, the protective circuit automatically becomes more sensitive.

Figure 4:
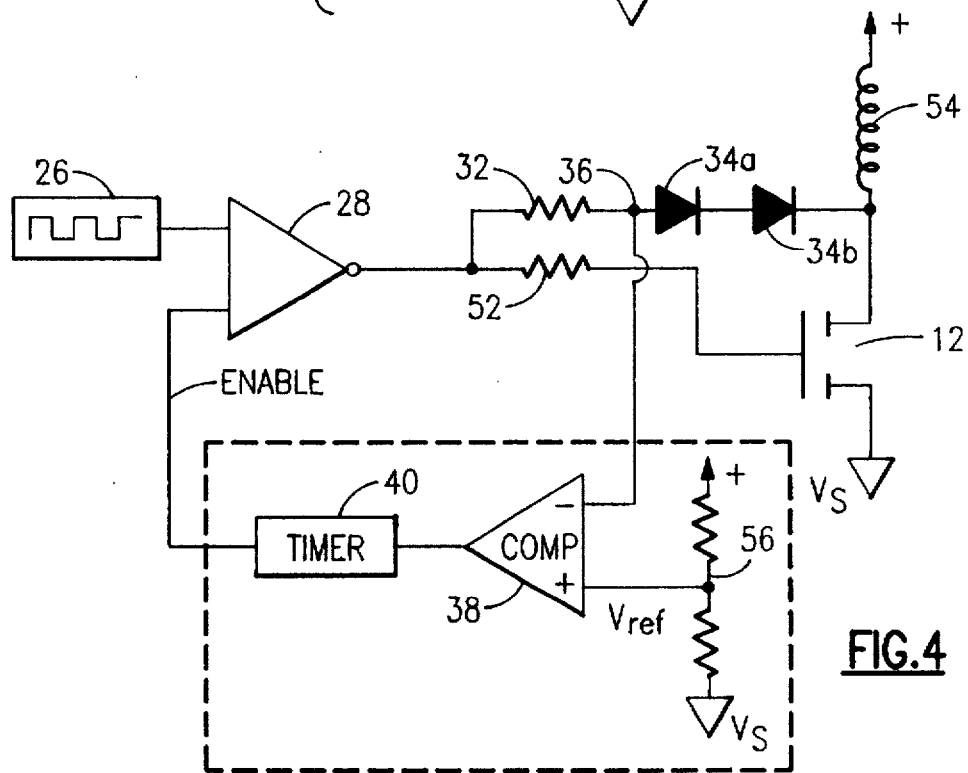
FIG. 4 shows the elements of the protective circuit of this embodiment.

Shown in FIG. 4, the diode can be realized as two diodes 34a, 34b connected in series. One of these diodes can be selected for high voltage performance, and the other for high speed switching performance. The two series diodes 34a, 34b also reduce the capacitance between drain and gate. In a practical embodiment, the timer 40 and associated threshold detector 38 (here shown as a voltage comparator) can be realized in a single timer element that is represented by the dash line box. A 555 timer circuit can be used for this purpose. Here, a load element 54 is shown in series with the drain electrode of the transistor 12 and a reference voltage source 56 is shown providing a reference voltage $V_{ref}$ offset above the source voltage $V_s$ of the transistor 12, to a reference input of the threshold detector 38.

The protective circuit of this invention can be realized using low-cost circuit devices and added to existing equipment or incorporated into new equipment. While the described embodiment of the protective circuit is employed with a switched mode half-bridge power supply, the protective circuit could be employed in many other applications in which a field effect transistor is switched on and off to control a load current. Also, while analog devices are used in the above-described embodiment, the protective circuit could also be realized using digital devices, programmed to protect the transistor when a predetermined reference value is exceeded.

In one possible preferred implementation, the inhibitable driver circuit 28, resistors 32 and 52, diodes 34a and 34b, comparator 38 and timer 40 can all be integrated into a circuit module. The reference voltage source 56 can be internal or external. In another possible implementation, all of the foregoing elements can be integrated into the transistor package with the power MOSFET 12.

While the invention has been described with reference to a preferred embodiment, it should be recognized that the invention is not limited to that embodiment. Rather, many modifications and variations would present themselves to persons skilled in the art without departing from the scope and spirit of the invention, as defined in the appended claims.

I claim:

1. Protective arrangement for a power field effect transistor of the type having a source electrode and a drain electrode, a channel between said source and drain electrodes that provides a conduction path for a load current, and a gate electrode coupled to a gating signal source, such that said conduction path has a low resistance value when a high gate voltage is applied from said gating signal source to said gate electrode and is shut off when a low gate voltage is applied to said gate electrode; comprising a gate resistor disposed between said gate signal source and said gate electrode;

drain-source voltage pickup means including a resistor coupled to said gating signal source, a diode in series with said resistor and connected to said drain electrode, the resistor and diode defining a junction therebetween providing a pickup voltage;

threshold detecting means having one input coupled to receive said pickup voltage from said junction of the drain-source voltage pickup means, another input coupled to a reference voltage that is offset a predetermined amount relative to said source electrode, and a threshold output that is high when said pickup voltage exceeds said reference voltage and is low otherwise; and cutoff circuit means having an input coupled to said threshold output for disabling said gate electrode for a preset delay period in response to a high level at the output of said threshold detecting means;

wherein said gate resistor, said drain-source voltage pickup means, said threshold detecting means, and said cutoff circuit means are configured as a circuit module coupled to said gate signal source, said gate, said source and said drain electrodes of said transistor.

2. The protective arrangement according to claim 1, wherein said cutoff circuit means comprises timer circuit means having an input coupled to the output of said threshold detecting means and an output providing a gate inhibit signal for a predetermined interval when said threshold output is high.

3. The protective arrangement of claim 2, said cutoff circuit means further comprising a gate inhibit circuit coupled between said gate electrode and said gating signal source and having an input coupled to receive said gate inhibit signal.

4. The protective arrangement of claim 1, wherein said diode has an anode and a cathode, said cathode being coupled to said drain electrode.

5. Protective arrangement for a power field effect transistor of the type having a source electrode and a drain electrode, a channel between said source and drain electrodes that provides a conduction path for a load current, and a gate electrode coupled to a gating signal source, such that said conduction path has a low resistance value when a high gate voltage is applied from said gating signal source to said gate electrode and is shut off when a low gate voltage is applied to said gate electrode; comprising a gate resistor disposed between said gate signal source and said gate electrode;

drain-source voltage pickup means including a resistor coupled to said gating signal source, a diode in series with said resistor and connected to said drain electrode, the resistor and diode defining a junction therebetween providing a pickup voltage;

cutoff circuit means having an input and serving for disabling said gate electrode for a period of time in response to a gate inhibit signal at said input; and integrated circuit module means including therewithin threshold detecting means having one input coupled to receive said pickup voltage from said junction of the drain-source voltage pickup means, another input coupled to a reference voltage that is offset a predetermined amount relative to said source electrode, and a threshold output that is high when said pickup voltage exceeds said reference voltage and is low otherwise; and timer circuit means having an input coupled to the output of said threshold detecting means and an output providing said gate inhibit signal to said cutoff circuit means input for a predetermined interval when said threshold output is high.

6. A combination power MOSFET and protective circuit therefor, said MOSFET and protective circuit being integrated together into a transistor package, the combination comprising a MOSFET which includes a source electrode and a drain electrode, a channel between said source and drain electrodes that provides a conduction path for a load current, and a gate electrode coupled to a gating signal source, such that said conduction path has a low resistance value when a high gate voltage is applied from said gating signal source to said gate electrode and is shut off when a low gate voltage is applied to said gate electrode; wherein a load device is connected in series with said MOSFET channel; a gate resistor having first and second ends, with the first end thereof being connected to the gate electrode of said MOSFET; a gate signal control circuit having a signal input connected to said gating signal source, a control input, and an output that is connected to the second end of said gate resistor; drain-source voltage pickup means including a pickup resistor coupled to the second end of said gate resistor and a diode in series with said pickup resistor and connected to said drain electrode, said second resistor and said diode defining a junction therebetween providing a pickup voltage; threshold detecting means having one input coupled to receive said pickup voltage from said junction of the drain-source voltage pickup means, another input coupled to a reference voltage that is offset a predetermined mount relative to said source electrode, and a threshold output that is of one sense when said pickup voltage exceeds said reference voltage and is of another, complementary sense otherwise; and circuit means having an input coupled to said threshold output and an output coupled to the second input of said gate signal control circuit for interrupting said gating signal and holding said MOSFET off for a period of time in response to the output of said threshold detecting means going to said one sense.

\* \* \* \* \*

UNITED STATES PATENT AND TRADEMARK OFFICE
CERTIFICATE OF CORRECTION

PATENT NO. : 5,737,169

DATED : April 7, 1998

INVENTOR(S) : Jeff C. Sellers

It is certified that error appears in the above-indentified patent and that said Letters Patent is hereby corrected as shown below:

Col. 2, line 44,
        "mount" should read --amount--.

Col. 3, line 16,
        "mined" should read --turned--.

Col. 3, line 26,
        "Rain" should read --$R_{ds-on}$--.

Col. 8, line 25,
        "mount" should read --amount--.

Signed and Sealed this

Twenty-third Day of June, 1998

Attest:

BRUCE LEHMAN

*Attesting Officer*        *Commissioner of Patents and Trademarks*